US009729128B2

(12) United States Patent
Srivastava et al.

(10) Patent No.: US 9,729,128 B2
(45) Date of Patent: Aug. 8, 2017

(54) AREA-DELAY-POWER EFFICIENT MULTIBIT FLIP-FLOP

(71) Applicant: Synopsys, Inc., Mountain View, CA (US)

(72) Inventors: Manish Srivastava, Bangalore (IN); Basannagouda Somanath Reddy, Cupertino, CA (US)

(73) Assignee: Synopsys, Inc., Mountain View, CA (US)

(*) Notice: Subject to any disclaimer, the term of this patent is extended or adjusted under 35 U.S.C. 154(b) by 9 days.

(21) Appl. No.: 14/682,413

(22) Filed: Apr. 9, 2015

(65) Prior Publication Data

US 2016/0301391 A1    Oct. 13, 2016

(51) Int. Cl.
*H03K 3/02* (2006.01)
*H03K 3/012* (2006.01)
*H03K 5/24* (2006.01)
*H03K 3/3562* (2006.01)

(52) U.S. Cl.
CPC ......... *H03K 3/012* (2013.01); *H03K 3/35625* (2013.01); *H03K 5/24* (2013.01)

(58) Field of Classification Search
CPC .. H03K 3/0233; H03K 3/02335; H03K 3/027; H03K 3/037; H03K 3/0375; H03K 3/26; H03K 3/28; H03K 3/281; H03K 3/286; H03K 3/2865; H03K 3/287; H03K 3/288; H03K 3/289; H03K 3/353; H03K 3/356; H03K 3/356008; H03K 3/356017; H03K 3/356026; H03K 3/356069; H03K 3/356086; H03K 3/356095; H03K 3/356104; H03K 3/356113; H03K 3/356121; H03K 3/35613; H03K 3/356139; H03K 3/356165; H03K 3/356173; H03K 3/356182; H03K 3/356191; H03K 3/3562; H03K 3/35625
USPC .................................................. 327/198–203
See application file for complete search history.

(56) References Cited

U.S. PATENT DOCUMENTS 5,072,138 A * 12/1991 Slemmer .......... G01R 31/31701
                                                    326/16
8,243,502 B2 * 8/2012 Sakimura ................ G11C 11/16
                                                    365/148

* cited by examiner

*Primary Examiner* — Lincoln Donovan
*Assistant Examiner* — Diana J Cheng
(74) *Attorney, Agent, or Firm* — Bever, Hoffman & Harms, LLP

(57) ABSTRACT

A multi-bit flip-flop (MBFF) includes a plurality of 1-bit flip-flops, each having an input data selection circuit that receives a data signal and a scan data signal. The MBFF also includes a local signal generation circuit that receives a global clock signal and a global scan enable signal, and in response, provides local control signals, wherein each of the local control signals is generated in response to both the global clock signal and the global scan enable signal. The local control signals are provided to the input data selection circuits, and exclusively control the input data selection circuits to route either the input data signal or the scan input data signal as a master data bit, reducing transistor requirements. Local clock signals may be generated by the local signal generation circuit in response to the global clock signal, and may exclusively control data transfer within the flip-flops, improving setup time.

21 Claims, 5 Drawing Sheets

AREA-DELAY-POWER EFFICIENT MULTIBIT FLIP-FLOP

FIELD OF THE INVENTION

The present invention relates to the optimization of a multi-bit flip-flop in an integrated circuit (IC). More specifically, an improved multi-bit flip-flop exhibits a reduced clock input capacitance, improved setup time, and reduced layout requirement (due to a reduced number of transistors).

BACKGROUND

Due to the rapid growth of chip densities and increasing clock frequencies in modern high performance integrated circuit (IC) designs, power consumption has become an important issue in IC chip design. A large portion of the total power consumption in synchronous IC chips is due to the operation of flip-flops in a clock network. In conventional synchronous designs, all one-bit flip-flops were considered as independent components. However, in recent years, as the process technology has advanced, and the feature size of the IC has shrunk, it has become possible for minimum size clock drivers to trigger more than one flip-flop. As a result, multi-bit flip-flops have been created, wherein multiple one-bit flip-flops are configured to be triggered from a clock signal provided from a single clock driver. Sharing the clock driver among multiple one-bit flip-flops can reduce the total clock dynamic power consumption, and reduce the total area contributed by the multiple flip-flops and clock driver.

FIG. 1 is a block diagram of a conventional 8-bit multi-bit flip-flop 100 that includes a clock driver 101 that receives a global clock signal CLK, and in response, provides local output clock signals CLKM and CLKMN using series-connected clock inverters 102 and 103. The clock signals CLK, CLKM and CLKMN are used to trigger the storage and transfer of data within master and slave latches in the eight 1-bit flip-flops 110-117. Multi-bit flip-flop 100 also includes a scan enable driver 105, that includes an inverter 106 for providing a local scan enable signal SEN in response to a global scan enable signal SE. The scan enable signals SE and SEN are used to select between the data inputs D0-D7 and the scan data inputs $S_I0$-$S_I7$, which are received by 1-bit flip-flops 110-117.

FIG. 2 is a circuit diagram of conventional 1-bit master-slave flip-flop 110, which represents a bit slice of multi-bit flip-flop 100. Note that flip-flops 111-117 are identical to flip-flop 110. Flip-flop 110 includes input select circuit 210, master latch circuit 230, master-to-slave transfer circuit 240, slave latch circuit 250 and output drivers 260 and 270, which are connected as illustrated. The operation of 1-bit master-slave flip-flop 110 is well known. Input select circuit 210 includes p-channel transistors 201-205 and n-channel transistors 211-215. Input select circuit 210 enables a master flop bit MFBN to be provided based on the input data signal D0, the scan input data signal $S_I0$, the scan enable signals SE and SEN, and the local clock signals CLKM and CLKMN. In general, input select circuit 210 drives the master flop bit MFBN during the half clock cycle that the local clock signal CLKMN is low and the local clock signal is high. If the scan enable signal SE is deactivated low, the data signal D0 is inverted to drive the master flop bit MFBN. Conversely, if the scan enable signal is activated high, the scan input data signal $S_I0$ is inverted to drive the master flop bit MFBN.

Master latch circuit 230 includes p-channel transistors 231-234 and n-channel transistors 235-238. Master latch circuit 230 allows the master flop bit MFBN to be latched in response to the local clock signals CLKM and CLKMN, thereby providing a latched master flop bit MFB. Transfer circuit 240 includes p-channel transistor 241 and n-channel transistor 242, which enable the latched master flop bit MFB to be routed as a slave flop bit SFB in response to the global clock signal CLK and the local clock signal CLKM. Slave latch circuit 250 includes p-channel transistors 251-254 and re-channel transistors 255-258, which allow the slave flop bit SFB to be latched, thereby providing the latched slave flop bit SFBN. Output driver 260 includes p-channel transistor 261 and n-channel transistor 262, which provide the Q0 data output signal in response to the latched slave flop bit SFBN. Output driver 270 includes p-channel transistor 271 and n-channel transistor 272, which provide the scan output data signal $S_O0$ in response to the latched slave flop bit SFBN.

A global reset data signal RD, which is applied to transistors 231, 237, 254 and 258, allows the outputs Q0 and $S_O0$ to be reset to logic '0' values (by setting the latched master flop bit MFB to a logic '0' value and the latched slave flop bit SFBN to a logic '1' value) when the reset data signal RD is activated low. This reset function can be eliminated by removing transistors 231, 237, 254 and 258 from flip-flop 110. Thus, 1-bit flip-flop 110 requires 32 transistors when implementing the reset data function, or 28 transistors when not implementing the reset data function.

FIG. 2 also illustrates the details of inverters 102, 103 and 106, which are implemented by p-channel transistors 221-223 and n-channel transistors 224-226, as illustrated, for a total of 6 transistors.

In general, multi-bit flip-flop 100 requires a large number of transistors (i.e., (8×32)+6=262 transistors), thereby requiring a relatively large layout area. In addition, because the global clock signal CLK is required to directly drive transistors corresponding to transistor 242 within each of the 1-bit flip-flops 110-117 (as well as the transistors 221 and 224 of inverter 102), the global clock network has a relatively high capacitance, thereby resulting in high dynamic power requirements and degraded performance within the multi-bit flip-flop 100.

It would therefore be desirable to have in improved multi-bit flip-flop design that reduces the required number of transistors and the associated layout area. It would further be desirable to have an improved multi-bit flip-flop design that reduces the capacitance of the global clock network, thereby reducing the dynamic power requirements and improving performance. It would further be desirable for the improved multi-bit flip-flop design to exhibit an improved data setup time, thereby further improving performance. It would further be desirable for such an improved multi-bit flip-flop to be fabricated using conventional processing techniques.

SUMMARY

Accordingly, the present invention provides an improved multi-bit flip-flop design having a relatively low transistor count, a relatively low global clock network capacitance, and a relatively low data setup time.

In accordance with one embodiment, a multi-bit flip-flop includes a plurality of 1-bit flip-flops coupled to a local signal generation circuit. Each of the 1-bit flip-flops includes an input data selection circuit that receives an input data signal and a scan input data signal. The local signal generation circuit is coupled to receive a global clock signal (CK) and a global scan enable signal (SE), and in response, provides local clock signals and local control signals. Each of the local control signals is generated in response to both the global clock signal and the global scan enable signal. The local control signals are provided to the input data selection circuits of the 1-bit flip-flops, and exclusively control these input data selection circuits to route either the input data signal or the scan input data signal as a master flop bit. The local control signals are generated such that the number of transistors required in each input data selection circuit is reduced by two (with respect to the input data selection circuit of a conventional multi-bit flip-flop). In a particular embodiment, the local signal generation circuit requires 12 transistors to generate the local control signals. Thus, as long as the multi-bit flip-flop includes more than six 1-bit flip-flops, the multi-bit flip-flop realizes an overall transistor reduction with respect to a conventional multi-bit flip-flop.

In a particular embodiment, the local signal generation circuit includes a first inverter to generate a first local clock signal (CKM#) in response to the global clock signal (CK), and a second inverter to generate a second local clock signal (CKM) in response to the first local clock signal. A third inverter generates a local scan enable signal (SE#) in response to the global scan enable signal (SE). The local signal generation circuit further includes a first NAND gate that generates a first local control signal (CKSE#) in response to the first local clock signal (CKM#) and the local scan enable signal (SE#), and an inverter that generates a second local control signal (CKSE) in response to the first local control signal (CKSE#). The local signal generation circuit further includes a second NAND gate that generates a third local control signal (CKSE1#) in response to the second local clock signal (CKM) and the global scan enable signal (SE), and an inverter that generates a fourth local control signal (CKSE1) in response to the third local control signal (CKSE1#). The first, second, third and fourth local control signals (CKSE#, CKSE, CKSE1# and CKSE1) control corresponding transistors in the input data selection circuit of each of the 1-bit flip-flops, thereby exclusively controlling the selection of the input data signal or the scan input data signal within these input data selection circuits.

In another embodiment, the first local clock signal (CKM#) and the second local clock signal (CKM) are used to directly drive the gates of transistors in a master-to-slave transfer circuit within the 1-bit flip-flops, thereby significantly reducing the data setup time within these 1-bit flip-flops (with respect to 1-bit flip-flops directly driven by the global clock signal).

In another embodiment, the global clock signal (CK) does not directly drive any transistors within the 1-bit flip-flops (e.g., transistors within the 1-bit flip-flops are driven with the local clock signals CKM# and CKM), thereby significantly reducing the capacitance associated with the global clock network (compared with a conventional multi-bit flip-flop).

In another embodiment, a reset (and/or set) functionality of the multi-bit flip-flop can be implemented by using the local signal generation circuit to generate a local control clock (CKRD) in response to the global clock signal (CK) and a global reset data signal (RD#). In a particular embodiment, the local control clock (CKRD) is provided using six transistors in the local signal generation circuit, and eliminates one transistor within a master latch circuit of each of the 1-bit flip-flops. Thus, transistor savings are realized for multi-bit flip-flops having more than six 1-bit flip-flops.

The present invention will be more fully understood in view of the following description and drawings.

DETAILED DESCRIPTION

In general, the present invention provides a multi-bit flip-flop that is implemented using 1-bit master-slave flip-flops having improved input select circuitry, which reduces the required number of transistors of the multi-bit flip-flop. In accordance with another embodiment, the required number of transistors of the multi-bit flip-flop can be further reduced when using 1-bit flip-flops that implement reset and/or set data functionality.

In addition, the global clock signal received by the multi-bit flip-flop is not applied directly to individual transistor gates within the 1-bit flip-flops, thereby reducing the capacitance seen by the global clock signal, and improving performance and power consumption. In addition, a master-to-slave transfer circuits within the 1-bit flip-flops are not directly driven by the global clock signal, thereby improving the data setup time of these flip-flops. Advantageously, the multi-bit flip-flop of the present invention can be fabricated using conventional processing techniques.

Figure 3:
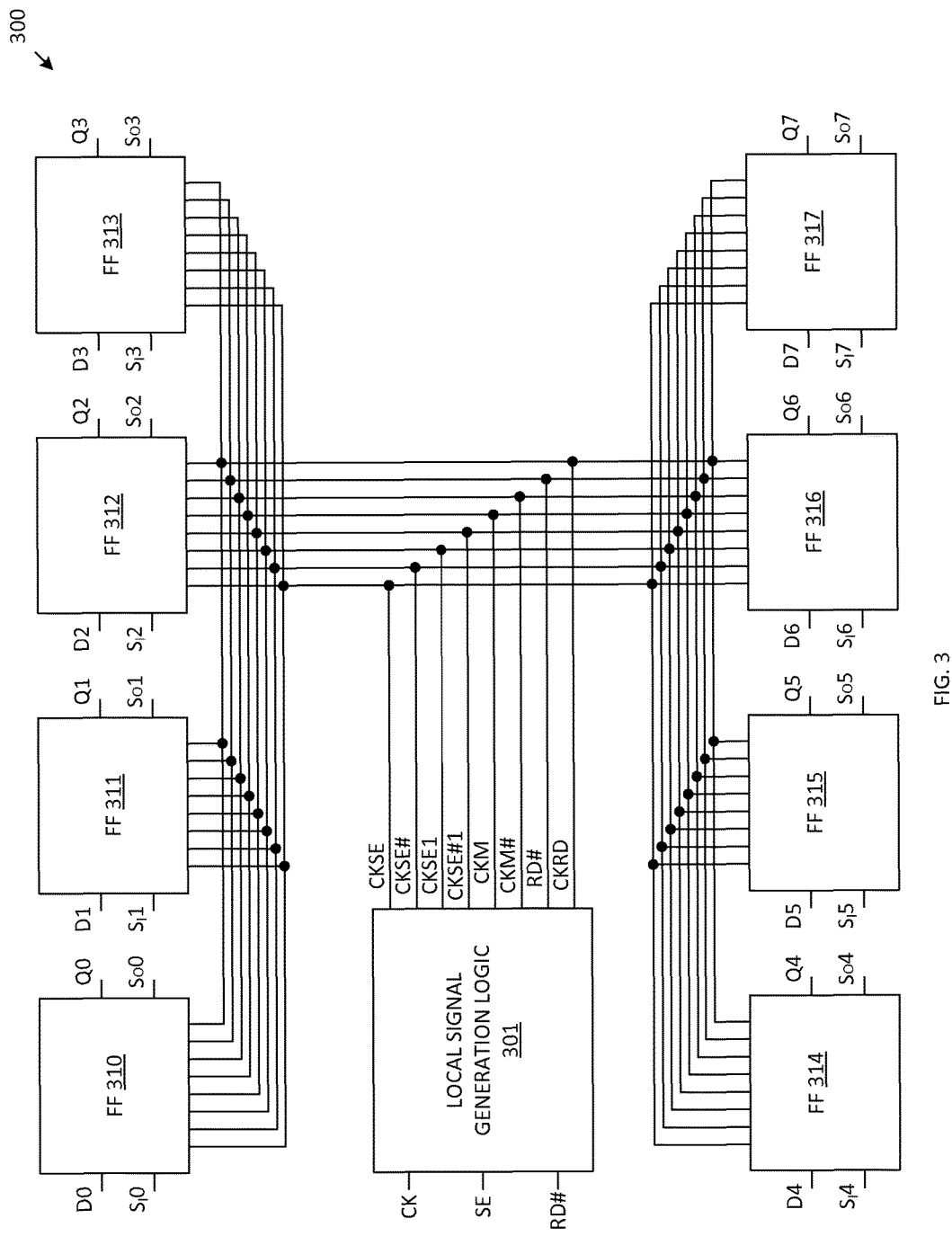
FIG. 3 is a block diagram of a multi-bit flip-flop in accordance with one embodiment of the present invention.

FIG. 3 is a block diagram of a multi-bit flip-flop 300 in accordance with one embodiment of the present invention. In the described examples, multi-bit flip-flop 300 includes eight 1-bit master-slave flip-flops 310-317. However, as described in more detail below, other numbers of 1-bit flip-flops can be used to implement multi-bit flip-flop 300 in other embodiments. Multi-bit flip-flop 300 also includes local signal generation logic 301, which receives a global clock signal CK, a global scan enable signal SE and a global reset data signal RD#, and in response, provides local clock signals CKM and CKM#, and local control signals CKSE, CKSE#, CKSE1, CKSE1# and CKRD (along with the global reset data signal RD#) to the 1-bit master-slave flip-flops 310-317.

Figure 4:
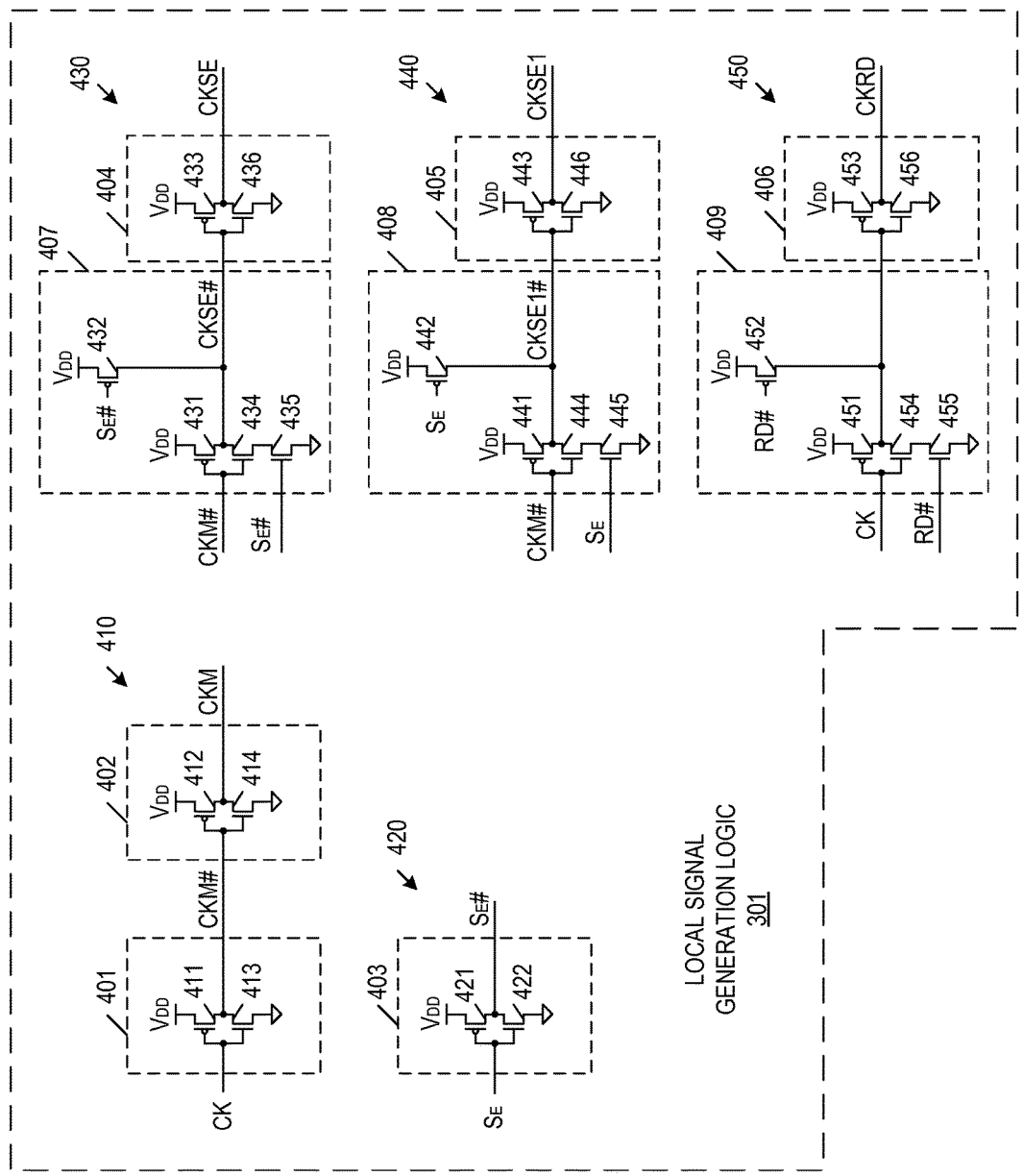
FIG. 4 is a circuit diagram of local signal generation logic of the multi-bit flip-flop of FIG. 3 in accordance with one embodiment of the present invention.

FIG. 4 is a circuit diagram illustrating local signal generation logic 301 in accordance with one embodiment of the present invention. Local signal generation logic 301 includes global clock processing circuit 410, which includes inverters 401-402, which are implemented by p-channel transistors 411-412 and n-channel transistors 413-414 as illustrated. Inverter 401 receives the global clock signal CK, and in response provides the local clock signal CKM#. Similarly, inverter 402 receives the local clock signal CKM#, and in response provides the local clock signal CKM. Note that the clock signal CKM# is slightly delayed with respect to the global clock signal CK, and the local clock signal CKM is slightly delayed with respect to the clock signal CKM#.

Local signal generation logic 301 also includes scan enable processing circuit 420, which includes inverter 403, which is implemented by p-channel transistor 421 and n-channel transistor 422 as illustrated. Inverter 403 receives the global scan enable signal SE, and in response provides the local scan enable signal SE#.

Local signal generation logic 301 also includes CKSE/CKSE# generation circuit 430, which includes p-channel transistors 431-433 and n-channel transistors 434-436, which are connected as illustrated. P-channel transistors 431-432 and n-channel transistors 434-435 form a logical NAND gate 407, and transistors 433 and 436 form an inverter 404. CKSE/CKSE# generation circuit 430 receives the local signals CKM# and SE#, and in response, generates the local control signals CKSE and CKSE#. In general, CKSE/CKSE# generation circuit 430 performs a logical NAND function in response to the received local signals CKM# and SE# to provide the local control signal CKSE#, and performs a logical AND function in response to the received local signals CKM# and SE# to provide the local control signal CKSE. Thus, when the local signal SE# has a logic '0' state (i.e., when the scan function is enabled), the CKSE# signal is driven to logic '1' state through p-channel transistor 432, and the CKSE signal is driven to a logic '0' state by the inverter 404 formed by transistors 433 and 436. When the local signal SE# signal has a logic '1' state (i.e., when the scan function is disabled), the inverter circuit formed by transistors 431 and 434 (in combination with the turned on transistor 435) provides the CKSE# signal in response to the local clock signal CKM#, and the inverter 404 provides the CKSE signal in response to the CKSE# signal.

Local signal generation logic 301 also includes CKSE1/CKSE1# generation circuit 440, which includes p-channel transistors 441-443 and n-channel transistors 444-446, which are connected as illustrated. P-channel transistors 441-442 and n-channel transistors 444-445 form a logical NAND gate 408, and transistors 443 and 446 form an inverter 405. CKSE1/CKSE1# generation circuit 440 receives the local clock signal CKM# and the global scan enable signal SE, and in response, generates the local control signals CKSE1 and CKSE1#. In general, CKSE1/CKSE1# generation circuit 440 performs a logical NAND function in response to the received signals CKM# and SE to provide the local control signal CKSE1#, and performs a logical AND function in response to the received signals CKM# and SE to provide the local control signal CKSE1. Thus, when the global scan enable signal SE has a logic '0' state (i.e., when the scan function is disabled), the CKSE1# signal is driven to logic '1' state through p-channel transistor 442, and the CKSE1 signal is driven to a logic '0' state by the inverter 405 formed by transistors 443 and 446. When the SE signal has a logic '1' state (i.e., when the scan function is enabled), the inverter circuit formed by transistors 441 and 444 (in combination with the turned on transistor 445) provides the CKSE1# signal in response to the local clock signal CKM#, and the inverter 405 provides the CKSE1 signal in response to the CKSE1# signal.

Local signal generation logic 301 also includes CKRD generation circuit 450, which includes p-channel transistors 451-453 and n-channel transistors 454-456, which are connected as illustrated. P-channel transistors 451-452 and n-channel transistors 454-455 form a logical NAND gate 409, and transistors 453 and 456 form an inverter 406. CKRD generation circuit 450 receives the global clock signal CK and the global reset data signal RD#, and in response, generates the local control signal CKRD. In general, CKRD generation circuit 450 performs a logical AND function in response to the received signals CK and RD# to provide the local control signal CKRD. Thus, when the reset data signal RD# has a logic '0' state (i.e., the reset data function is enabled), the CKRD signal is driven to a logic '0' state through p-channel transistor 452 and the inverter 406 formed by transistors 453 and 456. When the RD# signal has a logic '1' state (i.e., when the reset data function is not enabled), the inverter circuit formed by transistors 451 and 454 (in combination with the turned on transistor 455) and the inverter 406 provide the CKRD signal in response to the global clock signal CK.

Figure 5:
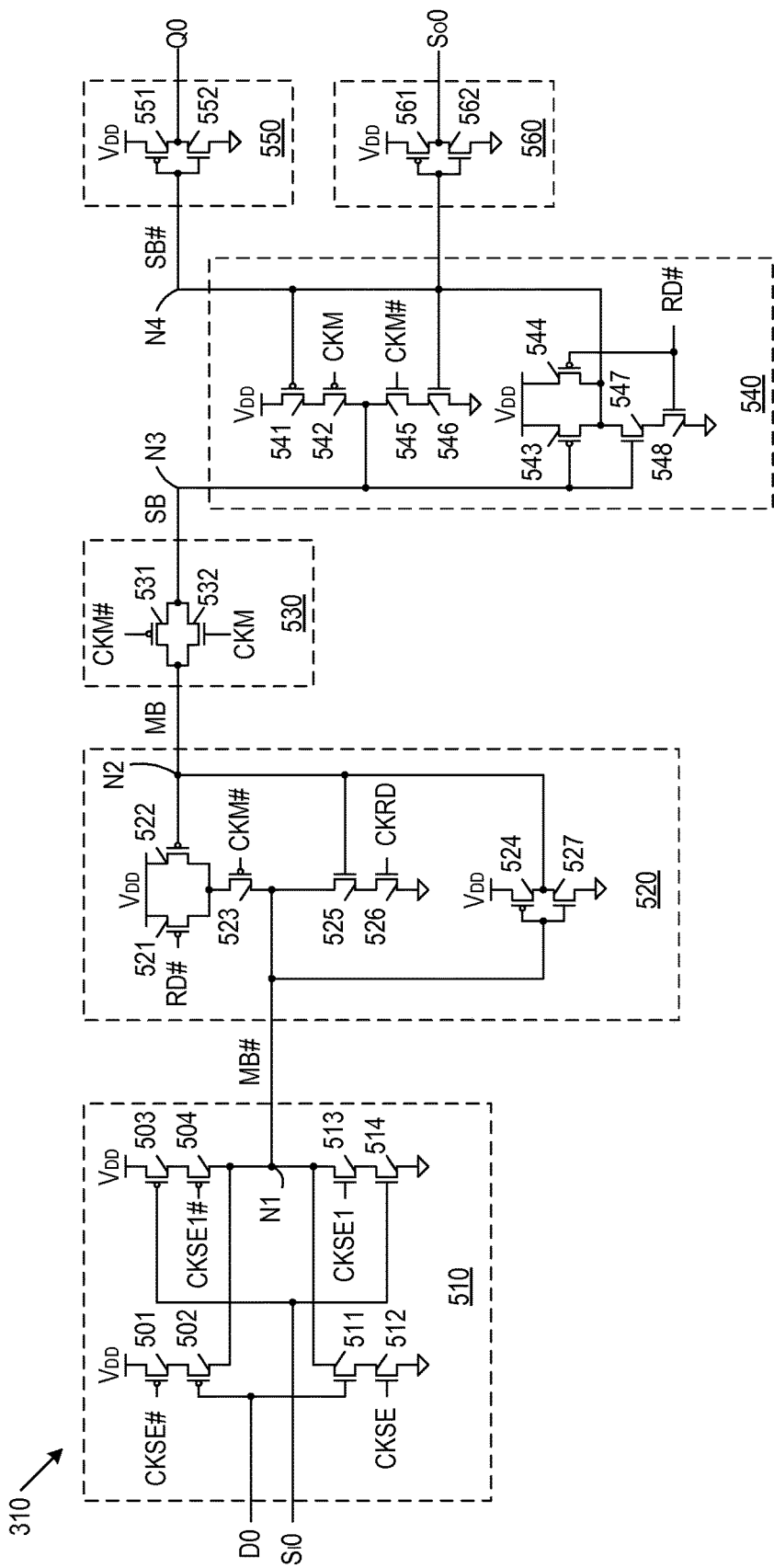
FIG. 5 is a circuit diagram of a 1-bit flip-flop used to implement the multi-bit flip-flop of FIG. 3 in accordance with one embodiment of the present invention.

FIG. 5 is a circuit diagram of 1-bit master-slave flip-flop 310 in accordance with one embodiment of the present invention. In the embodiments described herein, flip-flops 311-317 are identical to flip-flop 310. Flip-flop 310 includes data/scan input logic circuit 510, master stage latch 520, master-to-slave transfer circuit 530, slave stage latch 540, data output driver 550 and scan output driver 560.

Data/scan input logic circuit 510 includes p-channel transistors 501-504 and n-channel transistors 511-514. P-channel transistors 501-502 are connected in series between the $V_{DD}$ voltage supply terminal and first node N1, wherein the gate of p-channel transistor 501 is coupled to receive the local control signal CKSE#, and the gate of p-channel transistor 502 is coupled to receive the input data signal D0.

N-channel transistors 511-512 are connected in series between the ground supply terminal and first node N1, wherein the gate of n-channel transistor 511 is coupled to receive the data signal D0 and the gate of n-channel transistor 512 is coupled to receive the local control signal CKSE.

P-channel transistors 503-504 are connected in series between the VDD voltage supply terminal and first node N1, wherein the gate of p-channel transistor 503 is coupled to receive the scan data input signal $S_I0$, and the gate of p-channel transistor 504 is coupled to receive the local control signal CKSE1#.

N-channel transistors 513-514 are connected in series between the ground supply terminal and first node N1, wherein the gate of n-channel transistor 513 is coupled to receive the local control signal CKSE1, and the gate of re-channel transistor 514 is coupled to receive the scan data input signal $S_I0$.

Data/scan input logic circuit 510 provides a master flop bit MB# on node N1 in accordance with the following logic. As described above in connection with CKSE1/CKSE1# generation circuit 440 (FIG. 4), when the global scan enable signal SE has a logic '0' value (i.e., the scan function is disabled) the local control signal CKSE1# has a logic '1' value and the local control signal CKSE1 has a logic '0' value. As a result, transistors 504 and 513 are turned off within data/scan input logic circuit 510, such that the scan data input signal $S_I0$ has no effect on the state of the master flop bit MB# on node N1. Also, under these conditions, the local scan enable signal SE# has a logic '1' value (as provided by inverter 403), such that the local control signal CKSE# is the inverse of the local clock signal CKM# signal, and the local control signal CKSE is the inverse of the local control signal CKSE# (see, e.g., CKSE/CKSE# generation circuit 430). As a result, transistors 501 and 512 are turned on within data/scan input logic circuit 510 when the CKM# signal has a logic '1' value (i.e., CKSE#='0' and CKSE='1', or CK='0'). During this time, the inverse of the data input signal D0 is provided on node N1 as the master flop bit MB#. When the CKM# signal transitions to a logic '0' value, the local control signals CKSE# and CKSE transition to logic '1' and '0' values, respectively, wherein transistors 501 and 512 are turned off, such that the data/scan input logic circuit 510 does not actively drive the state of node N1. In this manner, data/scan input logic circuit 510 effectively enables the input data signal D0 to drive node N1 when the scan enable signal SE is deactivated to a logic '0' state and the global clock signal has a logic '0' state.

Conversely, as described above in connection with CKSE/CKSE# generation circuit 430 (FIG. 4), when the global scan enable signal SE has a logic '1' value, and the local scan enable signal SE# has a logic '0' value (i.e., the scan function is enabled) the local control signal CKSE# has a logic '1' value and the local control signal CKSE has a logic '0' value. As a result, transistors 501 and 512 are turned off within data/scan input logic circuit 510, such that the data input signal D0 has no effect on the state of the master flop bit MB# on node N1. Also, under these conditions, the logic '1' value of the global scan enable signal SE causes the local control signal CKSE1# to be the inverse of the local clock signal CKM# signal, and causes the local control signal CKSE1 to be the inverse of the local control signal CKSE1# (see, e.g., CKSE1/CKSE1# generation circuit 440). As a result, transistors 504 and 513 are turned on within data/scan input logic circuit 510 when the CKM# signal has a logic '1' value (i.e., CKSE1#='0' and CKSE1='1', or CK='0'). During this time, the inverse of the scan data input signal S$_I$0 is provided on node N1 as the master flop bit MB#. When the CKM# signal transitions to a logic '0' value, the local control signals CKSE1# and CKSE1 transition to logic '1' and '0' values, respectively, wherein transistors 504 and 513 are turned off, such that the data/scan input logic circuit 510 does not actively drive the state of node N1. In this manner, data/scan input logic circuit 510 effectively enables the scan data input signal S$_I$0 to drive node N1 when the scan enable signal SE is activated to a logic '1' state and the global clock signal CK has a logic '1' state.

Figure 1:
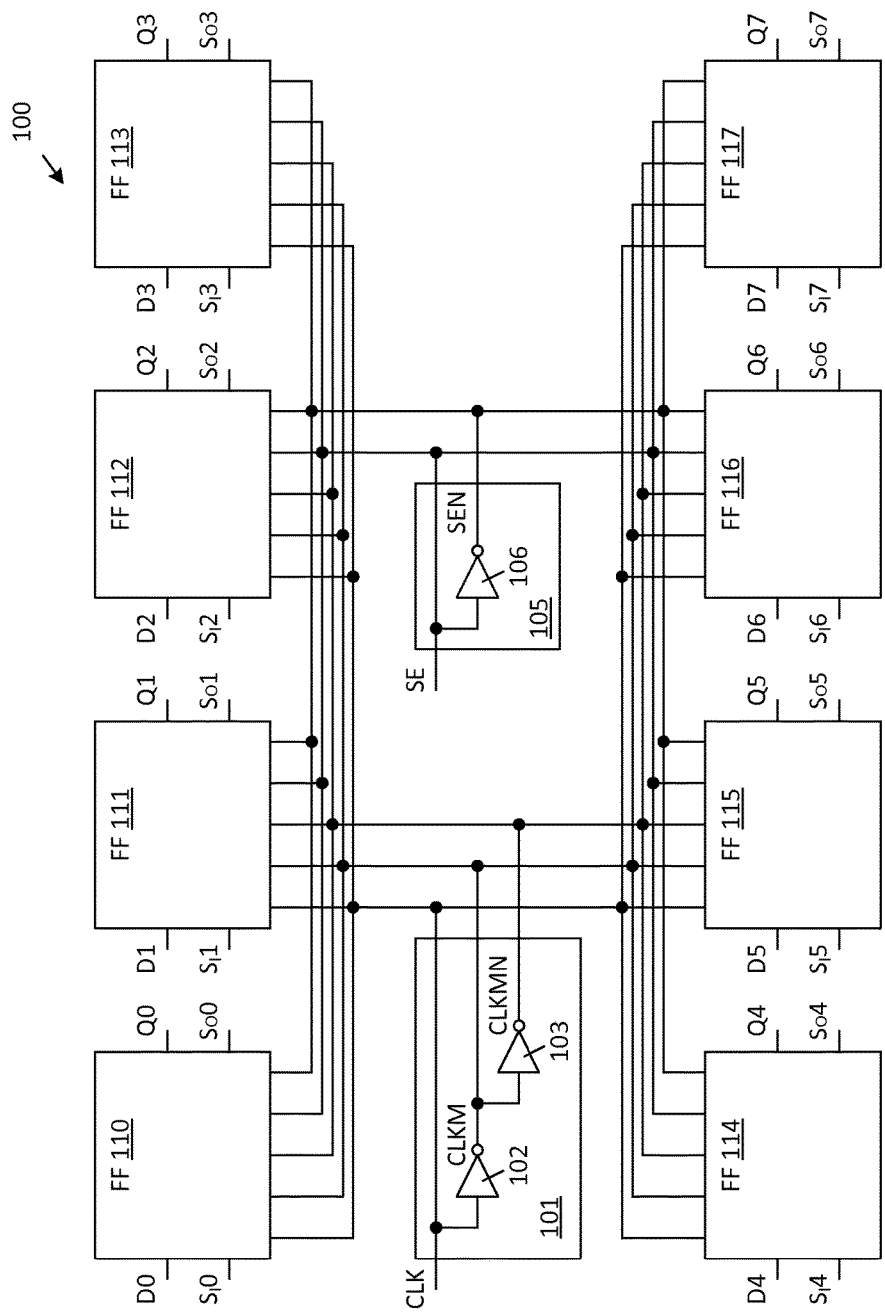
FIG. 1 is a block diagram of a conventional multi-bit flip-flop.
Figure 2:
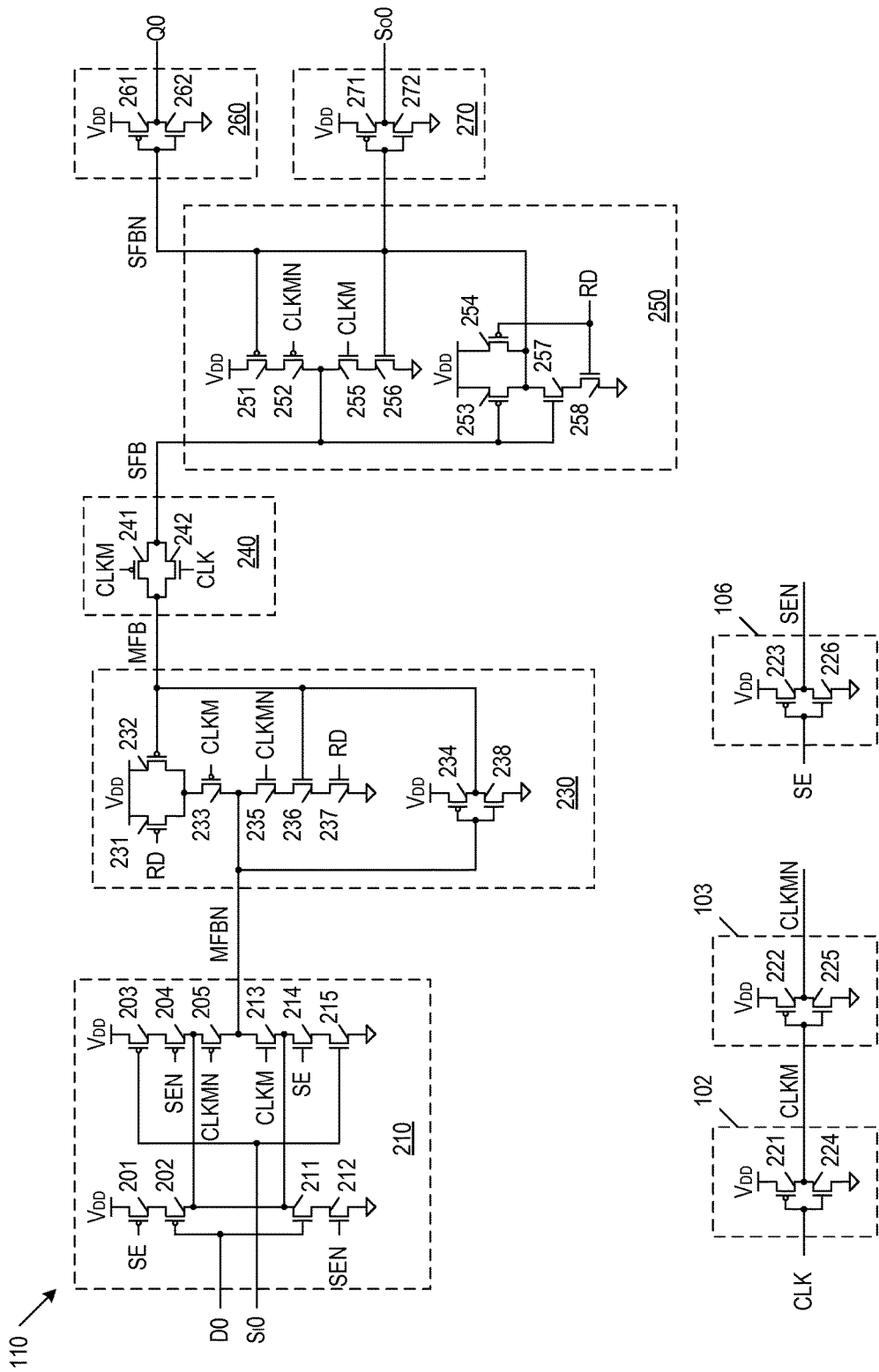
FIG. 2 is a circuit diagram of a conventional 1-bit master-slave flip-flop included in the multi-bit flip-flop of FIG. 1.

In the manner described above, local signal generation logic 301 and data/scan input logic 510 provide the master flop bit MB# within 1-bit flip-flop 310 of multi-bit flip-flop 300 in the same manner that local signal generation logic 101 and input logic 210 provide the master flop bit MFBN within 1-bit flip flop 110 of conventional multi-bit flip-flop 100. (FIGS. 1-2). Thus, providing the master flop bits MB# within each of the 1-bit flip-flops 310-317 of the 8-bit multi-bit flip-flop 300 requires 82 transistors (i.e., 18 transistors in local signal generation logic 301, and 8 transistors in the data/scan input logic circuit 510 of each of the eight 1-bit flip-flops 310-317). In contrast, providing the master flop bits MFBN within each of the flip-flops 110-117 of the conventional 8-bit multi-bit flip-flop 100 requires 86 transistors (i.e., 6 transistors in local signal generation logic 101, and 10 transistors in each of the eight 1-bit flip-flops 110-117). Thus, multi-bit flip-flop 300 realizes a four transistor savings with respect to conventional multi-bit flip-flop 100.

Stated another way, the local signal generation logic 301 of multi-bit flip-flop 300 requires 12 more transistors than the local signal generation logic 101 of conventional multi-bit flip-flop 100, and the data/scan input logic circuit 510 of multi-bit flip-flop 300 requires 2 fewer transistors than the input logic circuit 210 of conventional multi-bit flip-flop 100. Thus, a net transistor savings is realized for any multi-bit flip-flop that includes more than six 1-bit flip-flops. The net transistors savings can be defined as (N×2)−12, wherein N is equal to the number of bits in the multi-bit flip-flop. For example, a multi-bit flip-flop that includes sixteen 1-bit flip-flops in the manner described above would realize a net savings of 20 transistors (with respect to a conventional 16-bit flip-flop constructed in accordance with FIGS. 1-2.) In the foregoing manner, the required number of transistors of a multi-bit flip-flop can advantageously be reduced, thereby reducing the required layout area of the multi-bit flip-flop. In the described embodiment, the required layout area of multi-bit flip-flop 300 is about 12% less than the required layout area of conventional multi-bit flip-flop 100.

Returning now to FIG. 5, the master latch circuit 520 includes p-channel transistors 521-524 and n-channel transistors 525-527, which are connected as illustrated. Transistors 524 and 527 are connected to form an inverter between the first node N1 and a second node N2, such that the inverse of the master flop bit MB# signal is driven onto the second node N2 as the master flop bit MB. While the reset data signal RD# is deactivated high, p-channel transistor 521 is turned off, and the CKRD generation circuit 450 (FIG. 4) is enabled to route the global clock signal CK through a pair of inverter circuits to provide the CKRD signal to the gate of n-channel transistor 526. The gate of p-channel transistor 523 is coupled to receive the CKM# signal. The gate of p-channel transistor 522 and the gate of n-channel transistor 525 are coupled to the second node N2. Thus, during the half clock cycle that the CKM# signal has a logic '0' value and the CKRD signal has a logic '1' value, transistors 522, 523, 525 and 526 operate as an inverter, such that the master flop bits MB#/MB are latched in master stage latch 520.

When the reset data signal RD# is activated low, p-channel transistor 521 is turned on. The logic low state of the reset data signal RD# causes the local control signal CKRD to be driven to a logic low state (see, CKRD generation circuit 450), thereby turning off n-channel transistor 526. Under these conditions, the master flop bit MB# (node N1) will be pulled to a logic '1' state (to the VDD supply voltage) through p-channel transistors 521 and 523 (during half cycles that the CKM# signal is low). The inverter formed by transistors 524 and 527 will drive the master flop bit MB (node N2) to a logic '0' state.

In this manner, local signal generation logic 301 and master stage latch 520 provide the master flop bits MB#/MB within 1-bit flip-flop 310 of multi-bit flip-flop 300 in response to the reset data signal RD# in a functionally equivalent manner that local signal generation logic 101 and master stage latch 230 provide the master flop bits MFBN/MFB within 1-bit flip flop 110 of conventional multi-bit flip-flop 100 in response to the reset data signal RD. (FIGS. 1-2). Thus, resetting the master flop bits MB#/MB within the master latch stage 520 of each of the 1-bit flip-flops 310-317 of the 8-bit multi-bit flip-flop 300 requires 62 transistors (i.e., 6 transistors in CKRD generation circuit 450, and 7 transistors in the master stage latch 520 of each of the eight 1-bit flip-flops 310-317). In contrast, resetting the master flop bits MFBN/MFB within each of the flip-flops 110-117 of the conventional 8-bit multi-bit flip-flop 100 requires 64 transistors (i.e., 8 transistors in the master latch stage of each of the eight 1-bit flip-flops 110-117). Thus, multi-bit flip-flop 300 realizes a two transistor savings with respect to conventional multi-bit flip-flop 100.

Stated another way, the local signal generation logic 301 of multi-bit flip-flop 300 requires 6 more transistors than the local signal generation logic 101 of conventional multi-bit flip-flop 100 to implement the reset data function, and the master stage latch 520 of multi-bit flip-flop 300 requires 1 fewer transistor than the master stage latch 230 of conventional multi-bit flip-flop 100. Thus, a net transistor savings is realized for any multi-bit flip-flop that includes more than six 1-bit flip-flops. The net transistors savings can be defined as N−6, wherein N is equal to the number of bits in the multi-bit flip-flop. For example, a multi-bit flip-flop that includes sixteen 1-bit flip-flops in the manner described above would realize a net savings of 10 transistors (with respect to a conventional 16-bit flip-flop constructed in accordance with FIGS. 1-2.) In the foregoing manner, the required number of transistors of a multi-bit flip-flop can advantageously be reduced, thereby reducing the required layout area of the multi-bit flip-flop.

Master-to-slave transfer circuit 530 includes p-channel transistor 531 and n-channel transistor 532, which are connected in parallel between node N2 and node N3. The gate of p-channel transistor 531 is coupled to receive the CKM# signal and the gate of n-channel transistor 532 is coupled to receive the CKM signal. Thus, the master flop bit MB is routed to node N3 as the slave flop bit SB during the half clock cycles that the local clock signal CKM has a logic '1' value and the local clock signal CKM# has a logic '0' value.

Slave latch circuit 540 includes p-channel transistors 541-544 and n-channel transistors 545-548, which are connected as illustrated. While the reset data signal RD# is deactivated high, p-channel transistor 544 is turned off and n-channel transistor 548 is turned on, thereby allowing transistors 543 and 547 to operate as an inverter having an input coupled to third node N3 and an output coupled to fourth node N4. Under these conditions, the inverse of the slave flop bit SB is driven onto the fourth node N4 as the slave flop bit SB#. Notably, the gate of p-channel transistor 542 is coupled to receive the local clock signal CKM and the gate of n-channel transistor 545 is coupled to receive the local clock signal CKM#. The gate of p-channel transistor 541 and the gate of n-channel transistor 546 are coupled to the fourth node N4. Thus, during the half clock cycle that the CKM signal has a logic '0' value and the CKM# signal has a logic '1' value, transistors 541, 542, 545 and 546 operate as an inverter, such that the slave flop bits SB/SB# are latched in slave stage latch 540.

When the reset data signal RD# is activated low, p-channel transistor 544 is turned on and n-channel transistor 548 is turned off. Under these conditions, the slave flop bit SB# (node N4) will be pulled to a logic '1' state (to the VDD supply voltage) through p-channel transistor 544. The inverter circuit formed by transistors 541-542 and 545-546 will drive the slave flop bit SB (node N3) to a logic '0' state (during the half cycles when CKM is low and CKM# is high).

In this manner, slave stage latch 540 within 1-bit flip-flop 310 of multi-bit flip-flop 300 operates in a similar manner as slave latch stage 250 within 1-bit flip flop 110 of conventional multi-bit flip-flop 100.

Output driver 550 is an inverter formed by p-channel transistor 551 and n-channel transistor 552. Output driver 560 is an inverter formed by p-channel transistor 561 and re-channel transistor 562. Output drivers 550 and 560 provide the data output signal Q0 and scan data output signal $S_O0$, respectively, in response to the received slave flop bit SB#.

Unlike the conventional 1-bit flip-flop 110 implemented in multi-bit flip-flop 100, the 1-bit flip-flop 310 implemented in multi-bit flip-flop 300 does not include any transistors having gates directly driven by the global clock signal CK. More specifically, while the master-to-slave transfer circuit 240 of 1-bit flip-flop 310 includes an re-channel transistor 242 directly driven by the global clock signal CLK the master-to-slave transfer circuit 530 and the slave stage latch 540 of the 1-bit flip-flop 310 do not include any transistors directly driven by the global clock signal CK. As a result, the global clock signal CK associated with multi-bit flip-flop 300 is required to drive 8 fewer transistors than the global clock signal CLK associated with multi-bit flip-flop 100. As a result, the capacitance of the global clock network associated with multi-bit flip-flop 300 is less than the capacitance of the global clock network associated with multi-bit flip-flop 100. In the described embodiments, the capacitance of the global clock network can be reduced by a factor of about 16×. A system implementing multi-bit flip-flop 300 will therefore advantageously exhibit reduced dynamic power consumption and improved performance with respect to a system implementing multi-bit flip flop 100.

The setup time of multi-bit flip-flop 300 is defined as the time from the transition of the master flop bit MB (provided to master-to-slave transfer circuit 530) to the transition of the local clock signal CKM (which is also provided to master-to-slave transfer circuit 530). The master flop bit MB arrives at master-to-slave transfer circuit 530 (FIG. 5) faster than the master flop bit MFB arrives at master-to-slave transfer circuit 240 (FIG. 2), because input logic circuit 510 (FIG. 5) includes one fewer transistor in the data path than input select circuit 210 (FIG. 2). In addition, the master-to-slave transfer circuit 530 operates in response to the local clock signals CKM and CKM#, both of which are slightly delayed (by inverters 401 and 402) with respect to the global clock signal CK. These two factors (i.e., the reduced delay associated with the master flop bit MB and the increased delay associated with the local clock signals CKM/CKM#) significantly improve the setup time of multi-bit flip-flop 300 with respect to multi-bit flip-flop 100.

The clock-to-Q time is defined as the time from the transition of the global clock signal CK to the transition of the output data Q0. Because the master-to-slave transfer circuit 530 (FIG. 5) operates in response to the local clock signals CKM and CKM# (which are delayed with respect to the global clock signal CK), and the master-to-slave transfer circuit 240 (FIG. 2) operates directly in response to the global clock signal CLK, the clock-to-Q time of multi-bit flip-flop 300 is slightly longer than the corresponding clock-to-Q time of conventional multi-bit flip-flop 100.

The performance of a flip-flop may be defined by the sum of the setup time and clock-to-Q time (hereinafter referred to as the Tdead value). Because of the significant improvement of the setup time exhibited by multi-bit flip-flop, the Tdead value of multi-bit flip-flop 300 is significantly less than the Tdead value of the conventional multi-bit flip-flop 100. In the described example, the worst case Tdead value of 8-bit multi-bit flip-flop 300 is about 203.34 picoseconds (ps), with a worst case setup time of about −20.76 ps and a worst case clock-to-Q time of about 224.1 ps. In contrast, the worst case Tdead value of 8-bit multi-bit flip-flop 100 is about 280 picoseconds (ps), with a worst case setup time of about 124 ps and a worst case clock-to-Q time of about 156 ps. The Tdead value may improve as the multi-bit flip-flop 300 is expanded to include more bits. For example, a 16-bit multi-bit flip flop implemented accordance with the present invention has exhibited a Tdead value of about 188.34 ps (with a worst case setup time of −27.36 ps and a worst case clock-to-Q time of 215.7 ps). The relatively low Tdead value associated with multi-bit flip-flop 300 advantageously results in improved performance of this flip-flop.

The multi-bit flip-flop 300 of the present invention also provides for improved routing resource utilization, especially when considering design for testability (DFT). The improved routing resource utilization is achieved because the required routing resources for the scan chain of the multi-bit flip-flop 300 are greatly reduced because fewer transistors are required in the scan chain.

Advantageously, multi-bit flip-flop 300 can be realized in conventional CMOS/Fin-Fet process technology without the requirement of any specific process options, so there is no additional manufacturing cost associated with multi-bit flip-flop 300.

Although multi-bit flip-flop 300 has been described as including reset data functionality, it is understood that multi-bit flip-flop 300 can alternately be constructed to eliminate this reset data functionality by eliminating the associated circuitry (e.g., eliminating CKRD generation circuit 450, eliminating p-channel transistors 521 and 544 to create open circuits, and eliminating n-channel transistors 526 and 548 to create closed circuits to ground). It is also understood that multi-bit flip-flop 300 can be modified to replace the above-described reset data functionality with a 'set' data functionality. In yet another embodiment, multi-bit flip-flop 300 can be modified to implement both set and reset data functionality. The modifications required to implement such functionalities would be apparent to one of ordinary skill in view of the teachings provided herein. Although illustrative embodiments of the invention have been described in detail herein with reference to the accompanying figures, it is to be understood that the invention is not limited to those precise embodiments. Thus, the scope of the invention is defined by the following claims and their equivalents.

We claim:

1. A multi-bit flip-flop comprising:
   a plurality of flip-flops, each having a corresponding input data selection circuit coupled to receive a corresponding input data signal and a corresponding scan input data signal; and
   a local signal generation circuit coupled to receive a global clock signal and a global scan enable signal, and in response, provide a plurality of local control signals, wherein each of the local control signals is generated in response to both the global clock signal and the global scan enable signal, wherein the local control signals are provided to each of the input data selection circuits, and wherein the local control signals exclusively control the input data selection circuits.

2. The multi-bit flip-flop of claim 1, wherein each of the input data selection circuits includes exactly eight transistors.

3. The multi-bit flip-flop of claim 1, wherein each of the plurality of flip-flops further includes a corresponding master latch circuit coupled to receive the corresponding input data signal or the corresponding scan input data signal from the corresponding input data selection circuit based on the local control signals.

4. The multi-bit flip-flop of claim 3, wherein each of the plurality of flip-flops further includes:
   a corresponding slave latch circuit; and
   a corresponding transfer circuit that couples the corresponding master latch circuit to the corresponding slave latch circuit.

5. The multi-bit flip-flop of claim 4, wherein the local signal generation circuit further includes a local clock generation circuit for generating local clock signals in response to the global clock signal, wherein the transfer circuit within each of the plurality of flip-flops is controlled exclusively by the local clock signals.

6. The multi-bit flip-flop of claim 5, wherein the local signal generation circuit is further coupled to receive a global reset signal, and provide a local reset control signal in response to both the global reset signal and the global clock signal, wherein the local reset control signal is applied to each of the plurality of flip-flops.

7. The multi-bit flip-flop of claim 1, wherein the local signal generation circuit includes a local clock generation circuit for generating local clock signals in response to the global clock signal, wherein the local clock signals exclusively control data transfer between a master latch circuit and a slave latch circuit within each of the plurality of flip-flops.

8. The multi-bit flip-flop of claim 1, wherein the local signal generation circuit includes:
   an inverter that provides a first local clock signal in response to the global clock signal;
   a first inverter that provides a local scan enable signal in response to the global scan enable signal;
   a first NAND gate that provides a first local control signal in response to the first local clock signal and the local scan enable signal; and
   a second NAND gate that provides a second local control signal in response to the first local clock signal and the global scan enable signal.

9. The multi-bit flip-flop of claim 8, further comprising:
   a second inverter that provides a third local control signal in response to the first local control signal; and
   a third inverter that provides a fourth local control signal in response to the second local control signal.

10. The multi-bit flip-flop of claim 1, wherein the input data selection circuit within each of the plurality of flip-flops comprises:
    a first transistor and a second transistor coupled in series between a first voltage supply terminal and a first node, wherein the first transistor is controlled by a first one of the local control signals, and the second transistor is controlled by the input data signal;
    a third transistor and a fourth transistor coupled in series between the first node and a second voltage supply terminal, wherein the third transistor is controlled by the input data signal, and the fourth transistor is controlled by a second one of the local control signals;
    a fifth transistor and a sixth transistor coupled in series between the first voltage supply terminal and the first node, wherein the fifth transistor is controlled by a third one of the local control signals, and the sixth transistor is controlled by the scan input data signal; and
    a seventh transistor and an eighth transistor coupled in series between the first node and the second voltage supply terminal, wherein the seventh transistor is controlled by the scan input data signal, and the eighth transistor is controlled by a fourth one of the local control signals.

11. The multi-bit flip-flop of claim 10, wherein the first, second, third, fourth, fifth, sixth, seventh and eighth transistors are the only transistors of the input data selection circuit.

12. The multi-bit flip-flop of claim 1, wherein the local signal generation circuit includes:
    an inverter chain that provides a first local clock signal and a second local clock signal in response to the global clock signal,
    and wherein each of the plurality of flip-flops includes:
    a transfer circuit comprising a first transistor coupled in parallel with a second transistor between a master latch circuit and a slave latch circuit, wherein the first transistor is controlled by the first local clock signal and the second transistor is controlled by the second local clock signal.

13. The multi-bit flip-flop of claim 1, wherein each of the plurality of local control signals is provided to each of the input data selection circuits.

14. A method of operating a multi-bit flip-flop comprising:

generating a plurality of local control signals, wherein each of the local control signals is generated in response to both a global clock signal and a global scan enable signal; and applying each of the plurality of local control signals to a plurality of input data selection circuits of a corresponding plurality of flip-flops, wherein the local control signals exclusively control each of the input data selection circuits to selectively route one of a corresponding input data value and a corresponding scan input data value as a master data value.

15. The method of claim 14, further comprising storing the master data value in a master latch circuit in response to the local control signals.

16. The method of claim 15, further comprising:
generating local clock signals in response to the global clock signal; and
transferring the master data value from the master latch circuit to a slave latch circuit, wherein the transferring is controlled exclusively by the local clock signals.

17. The method of claim 15, further comprising
generating a local reset control signal in response to both the global reset signal and the global clock signal; and
resetting the master latch circuit in response to the local reset control signal.

18. The method of claim 14, wherein generating the plurality of local control signals comprises:
generating a first local clock signal in response to the global clock signal;
generating a local scan enable signal in response to the global scan enable signal;
performing a logical NAND operation in response to the first local clock signal and the local scan enable signal to provide a first local control signal; and
performing a logical NAND operation in response to the first local clock signal and the global scan enable signal to provide a second local control signal.

19. The method of claim 18, further comprising:
inverting the first local control signal to provide a third local control signal; and
inverting the second local control signal to provide a fourth local control signal.

20. A multi-bit flip-flop comprising:
means for generating a plurality of local control signals, wherein each of the local control signals is generated in response to both a global clock signal and a global scan enable signal; and
means for applying each of the plurality of local control signals to a plurality of input data selection circuits of a corresponding plurality of flip-flops, wherein the local control signals exclusively control each of the input data selection circuits to selectively route one of a corresponding input data value and a corresponding scan input data value as a master data value.

21. The multi-bit flip-flop of claim 20, further comprising:
means for generating local clock signals in response to the global clock signal; and
means for transferring the master data value from a master latch circuit to a slave latch circuit, wherein the means for transferring is controlled exclusively by the local clock signals.

* * * * *